(12) United States Patent
Choi et al.

(10) Patent No.: US 11,604,409 B2
(45) Date of Patent: Mar. 14, 2023

(54) TEMPLATE REPLICATION

(71) Applicant: CANON KABUSHIKI KAISHA, Tokyo (JP)

(72) Inventors: Byung-Jin Choi, Austin, TX (US); Anshuman Cherala, Austin, TX (US); Mario Johannes Meissl, Austin, TX (US)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 17/820,376

(22) Filed: Aug. 17, 2022

(65) Prior Publication Data
US 2022/0390834 A1 Dec. 8, 2022

Related U.S. Application Data

(62) Division of application No. 15/350,714, filed on Nov. 14, 2016, now Pat. No. 11,454,883.

(51) Int. Cl.
G03F 7/00 (2006.01)
B29C 43/02 (2006.01)
B29C 43/58 (2006.01)
B29C 59/02 (2006.01)

(52) U.S. Cl.
CPC .......... G03F 7/0002 (2013.01); B29C 43/021 (2013.01); B29C 43/58 (2013.01); B29C 59/022 (2013.01); B29C 2043/5808 (2013.01)

(58) Field of Classification Search
None
See application file for complete search history.

(56) References Cited

U.S. PATENT DOCUMENTS

| | | |
|---|---|---|
| 6,873,087 B1 | 3/2005 | Choi |
| 6,932,934 B2 | 8/2005 | Choi |
| 7,157,036 B2 | 1/2007 | Choi |
| 7,323,130 B2 | 1/2008 | Nimmakayala |

(Continued)

FOREIGN PATENT DOCUMENTS

| | | |
|---|---|---|
| CN | 1726429 A | 1/2006 |
| CN | 102203672 A | 9/2011 |

(Continued)

Primary Examiner — Mohammad M Ameen
(74) Attorney, Agent, or Firm — Canon U.S.A., Inc. IP Division

(57) ABSTRACT

Methods, systems, and apparatus for identifying dimensional attributes of a first active area of a template; based at least in part on the dimensional attributes of the first active area, determining a desired magnification correction of a second active area of a substrate; determining an out-of-plane distortion of the template, the substrate, or both; applying a back pressure to the template, the substrate, or both, to compensate for the out-of-plane distortion of the template, the substrate, or both; after compensating for the out-of-plane distortion of the template, the substrate, or both: i) contacting an imprint resist positioned on the substrate with the template such that pattern features in the first active area are filled by the imprint resist, and ii) applying an additional back pressure to the template, the substrate, or both, wherein the additional back pressure is selected such that the second active area exhibits the desired magnification correction.

8 Claims, 7 Drawing Sheets

(56) References Cited

U.S. PATENT DOCUMENTS

| | | | |
|---|---|---|---|
| 2004/0090611 A1* | 5/2004 | Choi | ............ B29C 43/36 355/75 |
| 2004/0124566 A1 | 7/2004 | Sreenivasan | |
| 2004/0146792 A1* | 7/2004 | Nimmakayala | ......... B29C 59/02 264/293 |
| 2004/0188381 A1 | 9/2004 | Sreenivasan | |
| 2004/0211754 A1 | 10/2004 | Sreenivasan | |
| 2004/0223131 A1 | 11/2004 | Choi | |
| 2005/0006343 A1 | 1/2005 | Choi | |
| 2005/0187339 A1 | 8/2005 | Xu | |
| 2007/0114686 A1 | 5/2007 | Choi | |
| 2010/0072652 A1 | 3/2010 | GanapathiSubramanian | |
| 2014/0094072 A1 | 4/2014 | Seki | |
| 2014/0210134 A1 | 7/2014 | Wakamatsu | |
| 2015/0076724 A1 | 3/2015 | Sato | |
| 2015/0183151 A1 | 7/2015 | Ganapathisubramanian | |
| 2016/0046045 A1 | 2/2016 | Matsumoto | |
| 2018/0117805 A1 | 5/2018 | Choi | |
| 2018/0149968 A1 | 5/2018 | Choi | |
| 2018/0169910 A1 | 6/2018 | Choi | |

FOREIGN PATENT DOCUMENTS

| | | |
|---|---|---|
| CN | 103843111 A | 6/2014 |
| CN | 105372932 A | 3/2016 |
| CN | 106030756 A | 10/2016 |
| JP | 2013011016 A | 1/2013 |
| JP | 2013110162 A | 6/2013 |
| JP | 2015056589 A | 3/2015 |
| TW | 200500811 A | 1/2005 |

* cited by examiner

TEMPLATE REPLICATION

CROSS-REFERENCE TO RELATED APPLICATIONS

This application is a divisional of U.S. application Ser. No. 15/350,714, which was filed on Nov. 14, 2016.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed.

SUMMARY

Innovative aspects of the subject matter described in this specification may be embodied in methods that include the actions of identifying one or more dimensional attributes of a first active area of a template; based at least in part on the identified dimensional attributes of the first active area of the template, determining a desired magnification correction of a second active area of a substrate; determining an out-of-plane distortion of the template, the substrate, or both; applying a back pressure to the template, the substrate, or both, to compensate for the out-of-plane distortion of the template, the substrate, or both; after compensating for the out-of-plane distortion of the template, the substrate, or both: i) contacting an imprint resist positioned on the substrate with the template such that pattern features in the first active area of the template are filled by the imprint resist, and ii) applying an additional back pressure to the template, the substrate, or both, wherein the applied additional back pressure is selected such that the second active area of the substrate exhibits the desired magnification correction.

Other embodiments of these aspects include corresponding systems and apparatus configured to perform the actions of the methods.

These and other embodiments may each optionally include one or more of the following features. For instance, the template is a master template and the substrate is a replica template. The desired magnification correction of the second active area of the substrate is determined prior to contacting the imprint resist with the template. The additional back pressure is applied to the template, the substrate, or both, while the template is in contact with the imprint resist positioned on the substrate. The out-of-plane distortion is one of a convex distortion or a concave distortion. Applying the additional back pressure to the template, the substrate, or both includes applying a positive additional back pressure to the template and a negative additional back pressure to the substrate to increase a size of the second active area of the substrate based on the desired magnification correction. Applying the additional back pressure to the template, the substrate, or both, includes applying a negative additional back pressure to the template and a positive additional back pressure to the substrate to decrease a size of the second active area of the substrate based on the desired magnification correction. Curing the imprint resist to form a patterned layer on the second active area of the substrate.

Innovative aspects of the subject matter described in this specification may be embodied in a system that includes a template chuck or holder configured to hold a template, the template including a first active area associated with one or more dimensional attributes; a substrate chuck or holder configured to hold a substrate, the substrate including a second active area; a detection system configured detect a plane of the template, the substrate, or both; a pressure system configured to apply a back pressure to the template, the substrate, or both; a controller in communication with the detection system and the pressure system, the controller configured to: i) determine, based on the detected plane of the template, the substrate, or both, an out-of-plane distortion of the template, the substrate, or both, ii) determine, based on the out-of-plane distortion of the template, the substrate, or both, a magnitude of back pressure to compensate for the out-of-plane distortion of the template, the substrate, or both, iii) provide a first signal to the pressure system such that the pressure system applies the magnitude of back pressure to the template, the substrate, or both, to compensate for the out-of-plane distortion of the template, the substrate, or both, iv) after compensating for the out-of-plane distortion of the template, the substrate, or both, determine a magnitude of additional back pressure based on a desired magnification correction of the second active area of the substrate, and v) provide a second signal to the pressure system such that the pressure system applies the magnitude of additional back pressure to the template, the substrate, or both, such that the second active area of the substrate exhibits the desired magnification correction.

Other embodiments of these aspects include corresponding methods performed by the system.

These and other embodiments may each optionally include one or more of the following features. For instance, the template is a master template and the substrate is a replica template. A fluid dispense system configured to dispense an imprint resist on the substrate; and a translation system configured to provide relative movement between the substrate and the template such that the template contacts the imprint resist positioned on the substrate to fill pattern features in the first active area of the template with the imprint resist. The pressure system is configured to apply the additional back pressure to the template, the substrate, or both, while the template is in contact with the imprint resist. An energy source to provide energy to cure the imprint resist forming a patterned layer on the second active area of the substrate. The out-of-plane distortion is one of a convex distortion or a concave distortion. The pressure system, based on the second signal, is configured to apply a positive additional back pressure to the template and a negative additional back pressure to the substrate to increase a size of the second active area of the substrate. The pressure system, based on the second signal, is configured to apply a negative additional back pressure to the template and a positive additional back pressure to the substrate to decrease a size of the second active area of the substrate based on the desired magnification correction.

Particular implementations of the subject matter described in this specification can be implemented so as to realize one or more of the following advantages. Implementations of the present disclosure provide minimizing, if not preventing, image placement error of the replica template and magnification control of the replica template.

The details of one or more embodiments of the subject matter described in this specification are set forth in the accompanying drawings and the description below. Other potential features, aspects, and advantages of the subject matter will become apparent from the description, the drawings, and the claims.

DETAILED DESCRIPTION

This document describes methods and systems that identify dimensional attributes of a first active area of a template; based at least in part on the dimensional attributes of the first active area, determine a desired magnification correction of a second active area of a substrate; determine an out-of-plane distortion of the template, the substrate, or both; apply a back pressure to the template, the substrate, or both, to compensate for the out-of-plane distortion of the template, the substrate, or both; after compensating for the out-of-plane distortion of the template, the substrate, or both: i) contact an imprint resist positioned on the substrate with the template such that pattern features in the first active area are filled by the imprint resist, and ii) apply an additional back pressure to the template, the substrate, or both, wherein the additional back pressure is selected such that the second active area exhibits the desired magnification correction.

Figure 1:
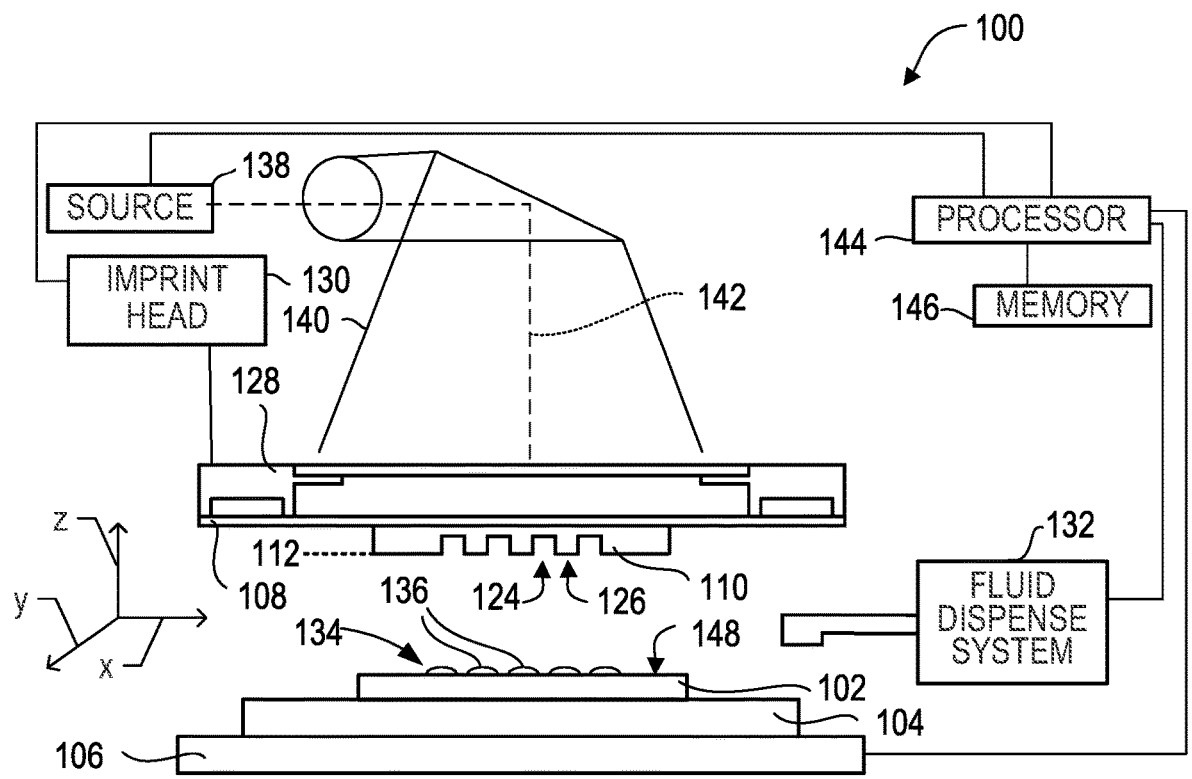
FIG. 1 illustrates a simplified side view of a lithographic system in accordance with embodiments of the present invention.

FIG. 1 illustrates an imprint lithography system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and/or the like. Exemplary chucks are described in U.S. Pat. No. 6,873,087, which is hereby incorporated by reference herein. The substrate 102 and the substrate chuck 104 may be further supported by a stage 106. The stage 106 provides motion about the x-, y-, and z-axes. The stage 106, the substrate 102, and the substrate chuck 104 may also be positioned on a base (not shown).

The imprint lithography system 100 further includes an imprint lithography template 108 that is spaced-apart from the substrate 102. In some examples, the template 108 includes a mesa 110 (mold 110) that extends from the template 108 towards the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. In the illustrated example, the patterning surface 122 includes a plurality of features defined by spaced-apart recesses 124 and/or protrusions 126. However, in some examples, other configurations of features are possible. The patterning surface 112 may define any original pattern that forms the basis of a pattern to be formed on substrate 102.

The template 108 may be coupled to a template chuck 128. In some examples, the template chuck 128 can include a vacuum chuck, a pin-type chuck, a groove-type chuck, an electromagnetic chuck, and/or the like. Exemplary chucks are described in U.S. Pat. No. 6,873,087, which is hereby incorporated by reference herein. Further, the template chuck 128 may be coupled to an imprint head 130 such that the template chuck 128 and/or the imprint head 130 may be configured to facilitate movement of the template 118.

The imprint lithography system 100 may further comprise a fluid dispense system 132. The fluid dispense system 132 may be used to deposit a polymerizable material 134 on the substrate 102. The polymerizable material 134 may be positioned upon the substrate 102 using techniques such as drop dispense, spin-coating, dip coating, chemical vapor deposition (CVD), physical vapor deposition (PVD), thin film deposition, thick film deposition, and/or the like. In some examples, the polymerizable material 134 is positioned upon the substrate 102 before and/or after a desired volume is defined between the mold 110 and the substrate 102. The polymerizable material 134 may comprise a monomer as described in U.S. Pat. No. 7,157,036 and U.S. Patent Application Publication No. 2005/0187339, all of which are hereby incorporated by reference herein. In some examples, the polymerizable material 134 is positioned upon the substrate 102 as a plurality of droplets 136.

Figure 2:
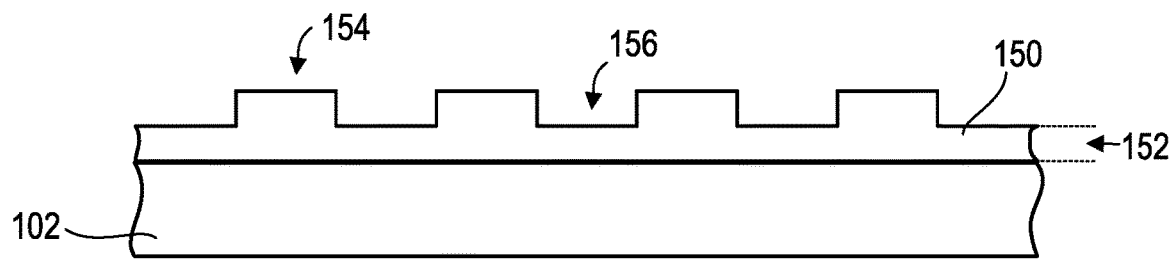
FIG. 2 illustrates a simplified side view of the substrate shown in FIG. 1 having a patterned layer positioned thereon.

Referring to FIGS. 1 and 2, the imprint lithography system 100 may further comprise an energy source 138 coupled to direct energy 140 along a path 142. In some examples, the imprint head 130 and the stage 106 is configured to position the template 108 and the substrate 102 in superimposition with the path 142. The imprint lithography system 110 may be regulated by a processor 144 in communication with the stage 106, the imprint head 130, the fluid dispense system 132, and/or the energy source 138, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 140, e.g., broadband ultraviolet radiation, causing the polymerizable material 134 to solidify and/or cross-link conforming to shape of a surface 148 of the substrate 102 and the patterning surface 122, defining a patterned layer 150 on the substrate 102. In some examples, the patterned layer 150 may comprise a residual layer 152 and a plurality of features shown as protrusions 154 and recessions 156, with the protrusions 154 having a thickness $t_1$ and the residual layer 152 having a thickness $t_2$.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

As previously described, the template 108 and the mold 110 make direct contact with the polymerizable material 134 deposited on the substrate 102 (e.g., a semiconductor wafer). Because such direct contact is made, it is generally recognized that the lifetime of the template 108 can be limited. As a result, known strategies have been adopted to account for the limited template lifetime. For example, a master template is fabricated using standard techniques, such as electron beam (e-beam) writing, to form a desired pattern into the master template. This master template is not directly used, however, to form patterns, e.g., on the substrate. Instead, a replication process is typically employed to create multiple replica templates, which are then used to directly form patterns on the substrate as previously described in FIGS. 1 and 2. The replication process likewise involves the use of nanoimprint lithography, with the master template used to transfer its pattern into a polymerizable material deposited on the surface of a replica template substrate (or "blank"), followed by solidification, separation and additional processing, e.g., etching, to transfer a corresponding relief image into the replica template substrate, thereby forming the replica template. In this instance, the replica template carries an inverse pattern of that of the master template. Such a replica itself can be used to create a further replica (i.e., a replica of a replica) in which case the further replica template would carry the same pattern as that of the master template.

To that end, during patterning of a wafer (e.g., for semiconductor devices) utilizing the replica template, as described above with respect to FIGS. 1 and 2, the process can be impacted by the ability of the imprint lithography system 100 to overlay the pattern being formed on the wafer to the already existing pattern on the wafer. Very precise pattern placement is required for the device to function correctly. Therefore, it is important to be able to compensate for any magnification errors present in the existing pattern on the wafer.

Provided herein are methods and systems to compensate for such previously described magnification errors by controlling and adjusting the magnification (i.e., size) of an active area of the replica template substrate relative to the master template active area. These methods rely, in part, on a template replication system and process that is able to apply either positive or negative pressure to the master template and/or the replica template substrate during imprinting.

Figure 3:
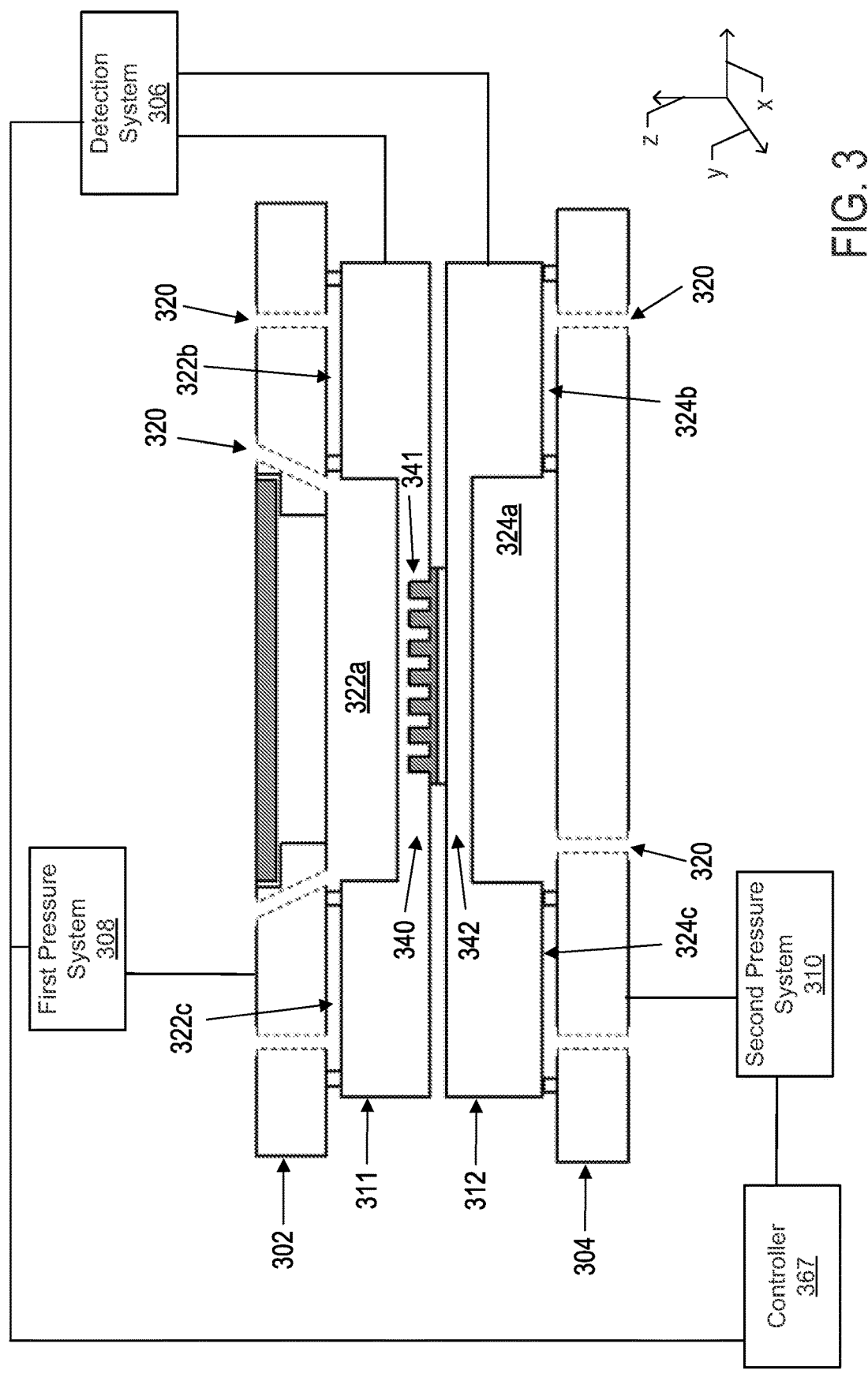
FIG. 3 illustrates a chucking system.

FIG. 3 illustrates a chucking system 300. The chucking system 300 holds, or maintains a desired positioning, of one or more templates, e.g., the template 108. The chucking system 300 includes a template chuck (or holder) 302, a substrate chuck (or holder) 304, a detection system 306, a first pressure system 308, a second pressure system 310, and a controller 367. The template holder 302 and the substrate holder 304 are both similar to the template chuck 128, mentioned above. Further, the template holder 302 is coupled to a template 311 (i.e., holds, or chucks, the template 311), and the substrate holder 304 is coupled to a substrate 312 (i.e., holds, or chucks, the substrate 312).

The template 311 includes a first active area 340. The first active area 340 can include pattern features 341, similar to the recesses 124 and protrusions 126 of FIG. 1, and can include the region that actively forms corresponding features in the substrate 312. The first active area 340 can include dimensional attributes, such as dimensional attributes in the x and y directions. The substrate 312 includes a second active area 342 that corresponds to the first active area 340, and can include the region that has features formed therein by the first active area 340.

In some examples, the template 311 is a master template and the substrate 312 is a replica template substrate (or blank). In some examples, the template 311, the substrate 312, or both, include a hollow (cored-out) body. That is, a thickness of the template 311, the substrate 312, or both, proximate to the first active area 340 and the second active area 342, respectively, is substantially thinner than a respective thickness of the template 311, the substrate 312, or both, outside of the corresponding active areas. In some examples, the template 311, the substrate 312, or both, includes a substantially uniform thickness across the body of the respective template 311, the substrate 312, or both.

Each of the template chuck 302 and the substrate chuck 304 can include channels 320. The channels 320 of the template chuck 302 extend between the first pressure system (or pressure source) 308 and one or more respective chambers 322a, 322b, 322c (collectively referred to as chambers 322); and the channels 320 of the substrate chuck 304 extend between the second pressure system (or pressure source) 310 and one or more respective chambers 324a, 324b, 324c (collectively referred to as chambers 324). The chambers 322 are defined between the template chuck 302 and the template 311 and the chambers 324 are defined between the substrate chuck 304 and the substrate 312. The chambers 322, 324 can provide cavities that a pressure (positive and/or negative) can be applied to by the respective pressure system. For example, the channels 320 can provide a pressure to the chambers 322, 324 via the appropriate pressure system 310 or 312. In some examples, the magnitude and/or the directionality of the pressure can vary for any subset of the chambers 322, 324 depending on the desired application. In some examples, the number of channels 320 and chambers 322, 324 can vary depending the desired application.

In the illustrated example, the chambers 322b, 322c can provide cavities that enable holding of the template 311 by applying the appropriate pressures (negative pressure, or vacuum) by the first pressure system 308 through the associated channels 320. Similarly, the chambers 324b, 324c can provide cavities that enable holding of the substrate 312 by applying the appropriate pressures (negative pressure, or vacuum) by the second pressure system 310 through the associated channels 320.

Further, in the illustrated example, the chamber 322a provides a cavity that facilitates adjusting of a distortion (e.g., out-of-plane), a magnification, or both, of the template 311 by applying the appropriate pressures by the first pressure system 308 through the associated channels 320, described further below. Similarly, the chamber 324a provides a cavity that facilitates adjusting of a distortion (e.g., out-of-plane), a magnification, or both, of the substrate 312 by applying the appropriate pressures by the second pressure system 310 through the associated channels 320, described further below.

The detection system 306 can include one or more scanning probes that have nanometer resolution to measure a plane of the template 311, the substrate 312, or both. The scanning probes can include on-tool laser systems and air gauges, or off-line interferometers with nanometer scale resolution.

The controller 367 can include a computing processing device (e.g., processor) and can be in communication with the detection system 306, the first pressure system 308, and the second pressure system 310. In general, the controller 367 receives data inputs, detailed below, and provides appropriate signals to the first pressure system 308, the second pressure system 310, or both, such that the appropriate pressure system applies appropriate pressure to one or more of the chambers 322a and 324a.

Figure 4A:
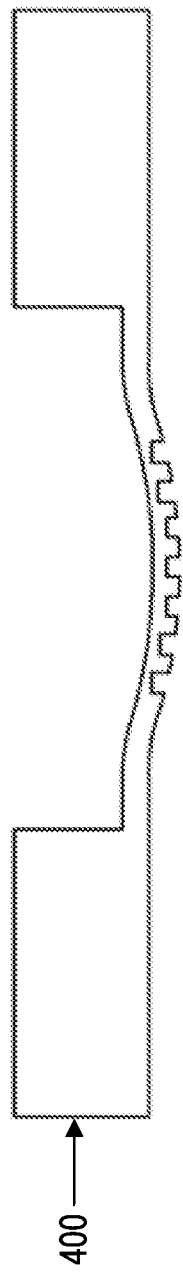
FIGS. 4A, 5A illustrate a template that is subjected to an out-of-plane distortion.
Figure 5A:
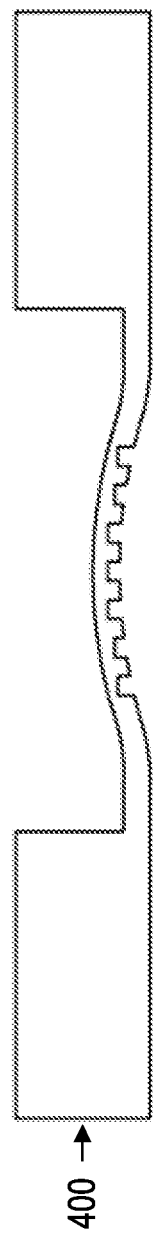

FIGS. 4A, 5A illustrate a template 400 that is subjected to an out-of-plane distortion. The template 400 can be similar to the template 311 or the substrate 312 of FIG. 3. To that end, the detection system 306 can determine the out-of-plane distortion of the template 400. Determining the out-of-plane distortion of the template 400 can include measuring a natural shape of the template 400 when the template 400 is not subjected to pressure from a pressure source (e.g., the first pressure system 310 or the second pressure system 312). In some examples, the initial shape of the template 400 can include a concave or a convex shape. In some examples, when the template 400 is the substrate 312, the detection system 306 can determine the out-of-plane distortion of the template 400 prior to forming a pattern in the template 400 or in a material positioned on the template 400, e.g., as described above with respect to FIGS. 1 and 2.

In the illustrated example of FIG. 4A, the detection system 306 can determine that the out-of-plane distortion of the template 400 includes a convex distortion from the perspective of the associated template chuck. In the illustrated example of FIG. 5A, the detection system 306 can determine that the out-of-plane distortion of the template 500 includes a concave distortion from the perspective of the associated template chuck.

Figure 4B:
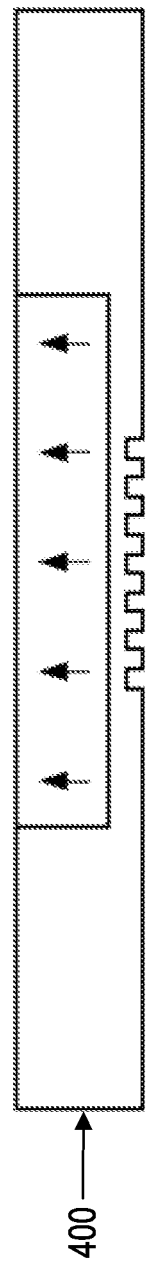
FIGS. 4B, 5B illustrate the template after compensation for the out-of-plane distortion.
Figure 5B:
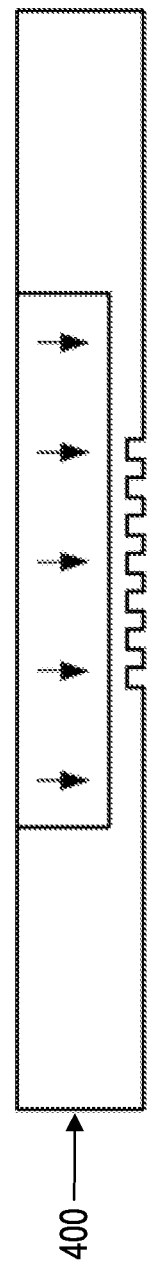

FIG. 4B, 5B illustrates the template 400 after compensation for the out-of-plane distortion, shown in FIGS. 4A, 5A, respectively. Specifically, with respect to FIG. 4B, a back pressure, e.g., a vacuum (or negative) pressure, is applied to the template 400 to compensate for the convex out-of-of plane distortion. Further, with respect to FIG. 5B, a back pressure, e.g., a positive pressure, is applied to the template 400 to compensate for the concave out-of-of plane distortion.

The controller 367 can determine the magnitude of the back pressure applied to the template 400 based on the detected plane of the template 400, and specifically, the out-of-plane distortion of the template 400. In some examples, the controller 367 determines the magnitude of the back pressure based on the magnitude and the degree of the determined out-of-plane distortion of the template 400. In some examples, the controller 367 determines the magnitude of the back pressure such that a desired plane (or shape profile) of the template 400 is obtained, e.g., a substantially flat plane. The controller 367 then provides a signal to the appropriate pressure system such that the appropriate pressure system applies the back pressure with the determined magnitude.

In some examples, when the template 400 is the template 311, the first pressure system 308, in response to the signal from the controller 367, applies the back pressure to the template 311 via the channels 320 and the chamber 322a to compensate for the out-of-plane distortion of the template 311. In the illustrated example of FIG. 4B, the first pressure system 308 applies a vacuum (or negative) pressure to the chamber 322a such that the portion of the template 311 proximate to the chamber 322a is in a desired configuration or plane, and specifically, the first active area 340 of the template 311 is pulled towards the vacuum pressure source. That is, the first pressure system 308 applies a vacuum pressure to the chamber 322a to obtain a desired shape profile of the first active area 340 of the template 311. Similarly, when the template 400 is the substrate 312, the second pressure system 310 applies the back pressure to the substrate 312 via the channels 320 and the chamber 324a to compensate for the out-of-plane distortion of the substrate 312, including obtaining a desired shape profile of the second active area 342 of the substrate 312, analogous to that described with respect to the template 311.

In the illustrated example of FIG. 5B, the first pressure system 308, in response to the signal from the controller 367, applies a positive pressure to the chamber 322a such that the portion of the template 311 proximate to the chamber 322a is in a desired configuration or plane, and specifically, the first active area 340 of the template 311 proximate to the chamber 322a is pushed away from the positive pressure source. That is, the first pressure system 308 applies a positive pressure to the chamber 322a to obtain a desired shape profile of the first active area 340 of the template 311. Similarly, when the template 400 is the substrate 312, the second pressure system 310 applies the back pressure to the substrate 312 via the channels 320 and the chamber 324a to compensate for the out-of-plane distortion of the substrate 312, including obtaining a desired shape profile of the second active area 342 of the substrate 312, analogous to that described with respect to the template 311.

In some examples, the first pressure system 308 applies the back pressure to the template 311 via the channels 320 and the chamber 322a to compensate for the out-of-plane distortion of the template 311 concurrently with the second pressure system 310 applying the back pressure to the substrate 312 via the channels 320 and the chamber 324b to compensate for the out-of-plane distortion of the substrate 312.

To that end, the out-of-plane distortion (i.e., initial shape) of the template 311 and the substrate 312 are compensated for, thereby settling the contact plane of both the template 311 and the substrate 312. As a result, determination of the magnification error/correction of the substrate 312, and compensation thereof, described below, is facilitated. Specifically, if the out-of-plane distortion of the template 311 and the substrate 312 is not compensated prior to determination of the magnification error/correction of the substrate 312, the substrate 312 can include unpredictable magnification error and/or image placement error relative to the template 312. In other words, in some examples, the out-of-plane distortion of the template 311 and/or the substrate 312 is determined and corrected for prior to determination and correction of the magnification correction of the substrate 312, described below.

The magnification correction of the substrate 312 can be based on at least the dimensional attributes of the first active area 340 of the template 311. In some examples, after patterning of a wafer (substrate) with the substrate 312 serving as a patterning template, the patterned wafer, and in particular an active area of the patterned wafer, can be associated with dimensional attributes (e.g., along the x and y directions). To that end, based on a comparison of these dimensional attributes of the patterned wafer, and the dimensional attributes of the first active area 340 of the template 311, the magnification correction of the second active area 342 of the substrate 312 can be determined. For example, the dimensional attributes of the patterned wafer can be larger or smaller in relation to the first active area 340 of the template 311.

In some examples, the magnification correction of the second active area 342 of the substrate 312 is determined and provided as an input signal to the controller 367. The controller 367, based on the magnification correction of the second active area 342 of the substrate 312, can determine the magnitude of an additional back pressures, described below, such that the second active area 342 of the substrate 312 exhibits the desired magnification correction.

Figure 6:
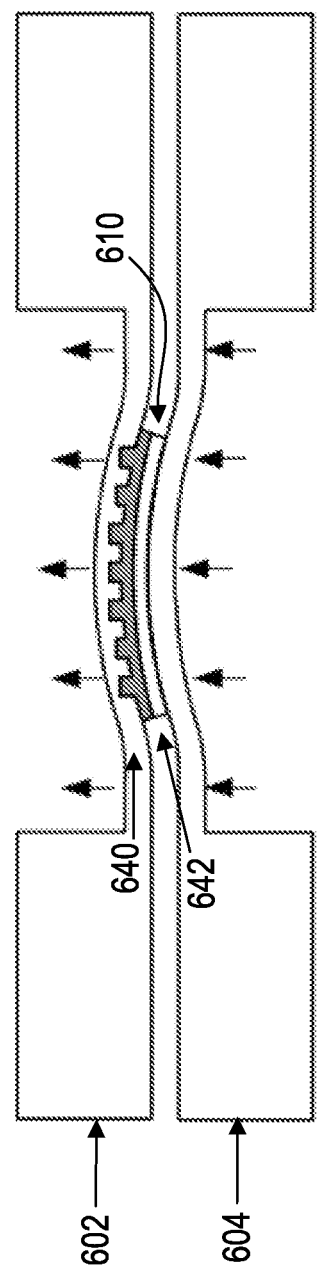
FIGS. 6, 7 illustrate a template and a substrate subjected to a magnification correction.
Figure 7:
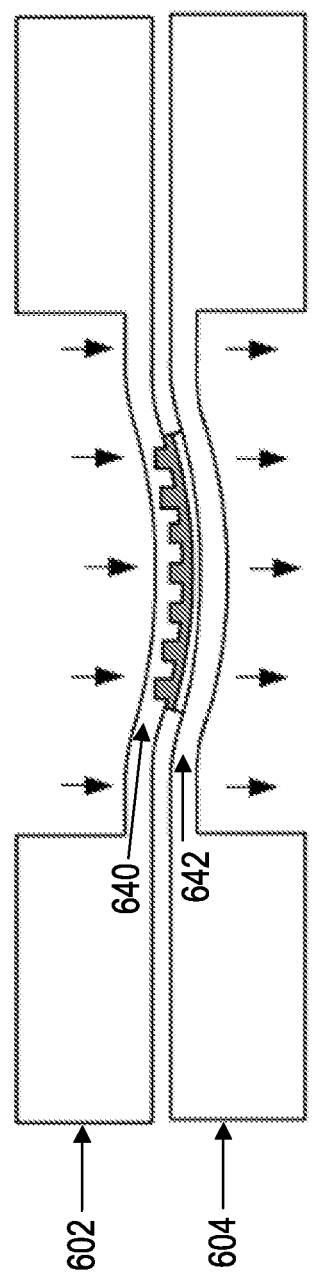

FIGS. 6 and 7 illustrates a template 602 and a substrate 604 subjected to a magnification error. The template 602 can be similar to the template 311 of FIG. 3 or the template 400 of FIGS. 4b, 5b, and include a first active area 640 similar to the first active area 340. The substrate 604 can be similar to the substrate 312 of FIG. 3, or the template 400 of FIGS. 4b, 5b, and include a second active area 642 similar to the second active area 342. In some examples, the template 602 can be the master template and the substrate 604 is the replica template substrate (or blank). To that end, after compensating for the out-of-plane distortion of the template 602 and/or the substrate 604, as described above with respect to template 400 of FIGS. 4a, 4b, 5a, and 5b, respectively, magnification correction or adjustment can be applied to the substrate 604.

In some implementations, after compensating for the out-of-plane distortion of the template 602 and/or the substrate 604, an imprint resist 610 is positioned on the substrate 604 and is contacted with the template 602 such that pattern features in the first active area 640 of the template 602 are filled by the imprint resist 610. For example, the imprint resist 610 (e.g., the polymerizable material 134) can be positioned on the substrate 604 by a fluid dispense system (e.g., the fluid dispense system 132). Furthermore, an imprint head (e.g., the imprint head 130) provides translation of the template 602 relative to substrate 604 such that pattern features (e.g., recessions 124) of the template 602 are filled by the imprint resist 610. Moreover, the imprint head provides translation of the template 602 relative to the substrate 604 after compensating for the out-of-plane distortion of each of the template 602 and the substrate 604.

In some embodiments, a first additional back pressure is applied to the template 602 and/or a second additional back pressure is applied to the substrate 604 to compensate for the magnification error such that the second active area 642 of the substrate 604 exhibits the desired magnification correction. For example, the controller 367 determines a magnitude of the first additional back pressure and/or a magnitude of the second additional back pressure based on a desired magnification correction of the second active area 642 of the substrate 604. The controller 367 generates a signal based on such and provides the signal to the first pressure system 308 and/or the second pressure system 310. The first pressure system 308, based on the signal, applies the first additional back pressure to the template 602 via the appropriate channels 320 and the chamber 322a, and the second pressure system 310 applies the second additional back pressure to the substrate 604 via the appropriate channels 320 and the chamber 324b to compensate for the magnification error of the substrate 604. In some examples, the first additional back pressure opposes the second additional back pressure. That is, a direction of the first additional back pressure opposes a direction of the second additional back pressure. For example, the first additional back pressure can include a vacuum (negative) pressure, and the second additional back pressure can include a positive pressure. Further, for example, the first additional back pressure can include a positive pressure, and the second additional back pressure can include a vacuum (negative) pressure.

In the illustrated example of FIG. 6, the first pressure system 308, based on the signal provided by the controller 367, applies a vacuum (negative) pressure to the chamber 322a such that the portion of the template 602 proximate to the chamber 322a (e.g., the first active area 640) is pulled away from the substrate 604, and the second pressure system 310, based on the signal provided by the controller 367, applies a positive pressure to the chamber 324a such that the portion of the substrate 604 proximate to the chamber 324a (e.g., the second active area 642) is pushed towards to the template 602. In this example, a concave bend is induced in the first active area 640 of the template 602, and a complementary convex bend is induced in the corresponding second active area 642 of the substrate 604.

To that end, by applying a vacuum (negative) pressure to the chamber 322a and a positive pressure to the chamber 324b to compensate for the magnification error, a size of the second active area 642 of the substrate 604 is decreased. That is, the second active area 642 of the substrate 604 (e.g., along the x-y axis, or a curvature of a surface of the substrate 604) is increased (e.g., stretched), and the first active area 640 of the template 602 (e.g., along the x-y axis, or a curvature of a surface of the template 602) is decreased (e.g., shrunk). The increase in the second active area 642 of the substrate 604 and the decrease in the first active area 640 of the template 604 is a result of the bowing (bending) of the active areas 640, 642 resulting from the vacuum pressure of the chamber 322a and the positive pressure of the chamber 324a.

Upon separation of the template 602 and the substrate 604, the bending of the template 602 and the substrate 604 is removed (cessation of the pressure applied by the pressure sources 308 and 310). The substrate 602 relaxes to its normal, unpressured state, and the second active area 642, including a pattern formed therein, becomes slightly smaller relative to its previous "stretched" state and to the first active area 640 of the template 602, representing a decreased magnification.

In the illustrated example of FIG. 7, the first pressure system 308, based on the signal provided by the controller 367, applies a positive pressure to the chamber 322a such that the portion of the template 602 proximate to the chamber 322a (e.g., the first active area 640) is pushed towards the substrate 604 and the second pressure system 310, based on the signal provided by the controller 367, applies a vacuum (negative) pressure to the chamber 324a such that the portion of the substrate 604 proximate to the chamber 324a (e.g., the second active area 642) is pulled away from the template 602. In this example, a convex bend is induced in the first active area 640 of the template 602, and a complementary concave bend is induced in the corresponding second active area 642 of the substrate 604.

To that end, by applying a positive pressure to the chamber 322a and a vacuum pressure to the chamber 324a to compensate for the magnification error, a size of the second active area 642 of the substrate 604 is increased. That is, the second active area 642 of the substrate 604 (e.g., along the x-y axis, or a curvature of a surface of the substrate 604) is decreased (e.g., shrunk, contracted), and the first active area 640 of the template 602 (e.g., along the x-y axis, or a curvature of a surface of the template 602) is increased (e.g., stretched). The decrease in the second active area 642 of the substrate 604 and the increase in the first active area 640 of the template 602 is a result of the bowing (bending) of the active areas 640, 642 resulting from the positive pressure of the chamber 322a and the negative pressure of the chamber 324a.

Upon separation of the template 602 and the substrate 604, the bending of the template 602 and the substrate 604 is removed (cessation of the pressure applied by the pressure sources 308 and 310). The substrate 602 relaxes to it's normal, unpressured state, and the second active area 642, including a pattern formed therein, becomes slightly larger relative to its previous "contracted" state and to the first active area 640 of the template 602, representing an increased magnification.

In some examples, the pressure of the chamber 322a and the pressure of the chamber 324a are proportional. For example, in the illustrated example of FIG. 6, the magnitude of the vacuum pressure of the chamber 322a and the magnitude of the positive pressure of the chamber 324a are substantially the same; and in the illustrated example of FIG. 7, the magnitude of the positive pressure of the chamber 322a and the magnitude of the vacuum pressure of the chamber 324a are substantially the same.

In some examples, the first pressure system 308 applies the first additional back pressure to the template 602 and/or the second pressure system 310 applies the second additional back pressure to the substrate 604 while the imprint resist 610 is in contact with the template 602. Applying the first additional back pressure and/or the second additional back pressure while the imprint resist 610 is in contact with the template 602 can provide improved accuracy in the magnitude of the first additional back pressure and the second additional back pressure applied to facilitate compensating for the out-of-plane distortion and magnification error.

In a use-case example, both the master template (e.g., the template 311) and replica blank (e.g., the substrate 312) start as conventional 6 inch by 6 inch by 0.25-inch blank fused silica plates. The center 64 mm areas are then cored out and set to a thickness of 1.1 mm. The maximum patterned area (i.e., active area) is 26 mm×33 mm, in the y and x directions respectively, which is a semiconductor industry standard. The relief patterns on the master template are transferred on to the 26 mm×33 mm mesa centered in the cored out region of the replica template.

For example, under these conditions, if a positive pressure of 1 kPa is applied to the master template, the resultant magnification change to the replica template active area (e.g., the second active area 342), as calculated using finite element analysis, will be −3.34 ppm in x and −3.48 ppm in y. Likewise, if a negative pressure of 1 kPa is applied to the master template, the resultant magnification change to the replica template active area (e.g., the second active area 342), again as calculated using finite element analysis, will be 3.34 ppm in x and 3.48 ppm in y. It will be understood that any combination of pressure adding to +/−1 kPa will result in the same magnification change for the replica. If more or less magnification is required, the total back side pressure can be changed accordingly. It will also be understood that a range of pressures can be applied provided that at no time can pressures be increased to the point where they begin to impact the vacuum forces being used to hold the template and replica in place by their respective holding chucks.

Further, the thicknesses of the template and replica active areas can be as little as 0.100 mm and as large as 6.35 mm. In addition, the master and replica thicknesses and cored out diameters can be the same or different. In addition to fused silica templates and replicas, other template materials are contemplated. Thermal nanoimprint lithography, as an example, uses a thermal process to cure the nanoimprint resist. A typical template material used in thermal nanoimprint lithography is silicon. Additional possible template materials include polymers and plastics. For the cases of polymers and plastics, because the Young's modulus are much lower than that of either silicon or fused silica, their thicknesses can be much greater than 1.1 mm, for example approaching 5 to 6 mm or greater, and still achieve enough induced bending from the applied back pressure to achieve the desired active area alignment area adjustments. Furthermore, master templates and replicas are also not confined to the 6 in ×6 in plate configuration. Silicon substrates, as an example, are often round, and have diameters ranging from 50 mm up to 450 mm. Templates can also be plate shaped, with varying x and y dimensions as well as varying thicknesses.

Figure 8:
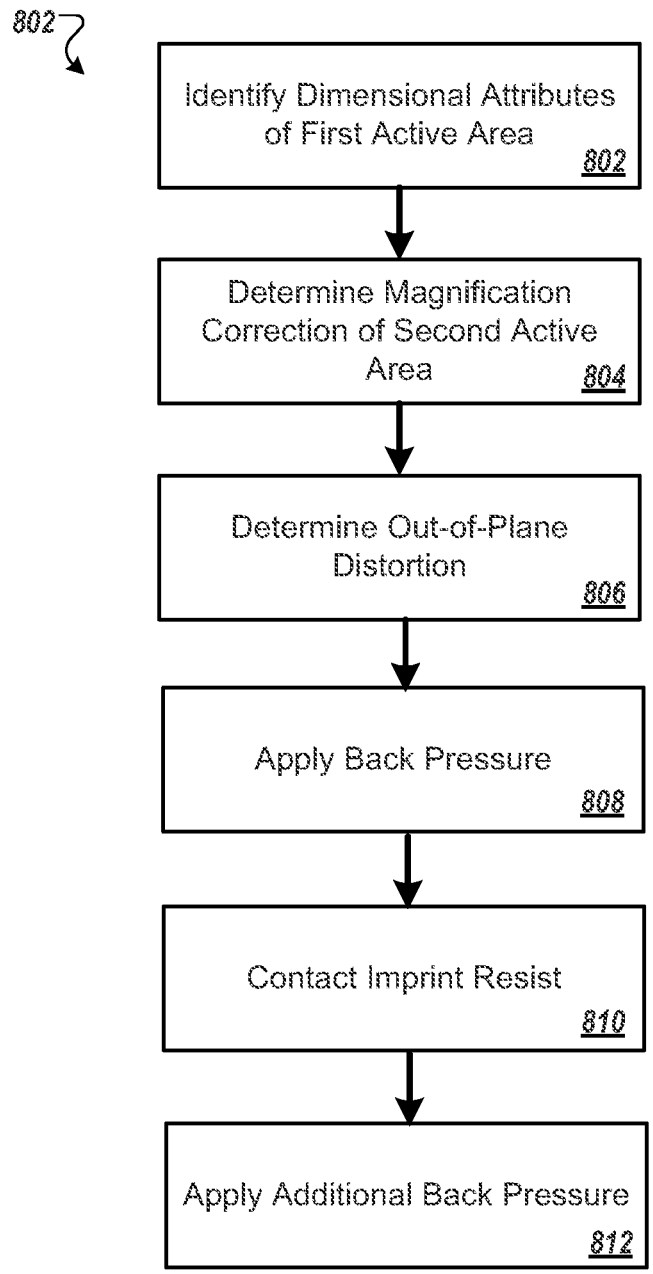
FIG. 8 illustrates an example method of providing magnification control of a substrate.

FIG. 8 illustrates an example method of providing magnification control of a substrate. The process 800 is illustrated as a collection of referenced acts arranged in a logical flow graph. The order in which the acts are described is not intended to be construed as a limitation, and any number of the described acts can be combined in other orders and/or in parallel to implement the process.

Dimensional attributes of a first active area of a template are identified (802). For example, the first active area 340 of the template 311 is associated with dimensional attributes along x and y directions. A desired magnification correction of a second active area of a substrate is determined based at least in part on the dimensional attributes of the first active area of the template (804). For example, the detection system 306 determines the desired magnification correction of the second active area 342 of the substrate 312 based on the dimensional attributes of the first active area 340 of the template 311. An out-of-plane distortion of the template and/or the substrate is determined (806). For example, the detection system 306 determines the out-of-plane distortion of the template 311 and/or the substrate 312. A back pressure is applied to the template and/or the substrate to compensate for the out-of-plane distortion of the template and/or the substrate (808). For example, the first pressure system 308 applies the back pressure to the template 311 via the channels 320 and the chamber 322a to compensate for the out-of-plane distortion of the template 311 and/or the second pressure system 310 applies the back pressure to the substrate 312 via the channels 320 and the chamber 324a to compensate for the out-of-plane distortion of the substrate 312.

After compensating for the out-of-plane distortion of the template and/or the substrate, an imprint resist positioned on the substrate is contacted with the template such that pattern features in the first active area of the template are filled by the imprint resist (810). For example, the template 602 contacts the imprint resist 610 positioned on the substrate 604. Additionally, after compensating for the out-of-plane distortion of the template and/or the substrate, an additional back pressure is applied to the template and/or the substrate, the additional back pressure is selected such that the second active area of the substrate exhibits the desired magnification correction (812). For example, the first pressure system 308 applies the first additional back pressure to the template 602 via the appropriate channels 320 and the chamber 322a and/or the second pressure system 310 applies the second additional back pressure to substrate 604 via the appropriate channels 320 and the chamber 324a to compensate for the magnification error.

What is claimed is:

1. An imprint lithography system comprising:
a template chuck or holder configured to hold a template, the template including a first active area associated with one or more dimensional attributes;
a substrate chuck or holder configured to hold a substrate, the substrate including a second active area;
a detection system configured detect a plane of the template, the substrate, or both;
a pressure system configured to apply a back pressure to the template, the substrate, or both;
a controller in communication with the detection system and the pressure system, the controller configured to:

i) determine, based on the detected plane of the template, the substrate, or both, an out-of-plane distortion of the template, the substrate, or both, ii) determine, based on the out-of-plane distortion of the template, the substrate, or both, a magnitude of back pressure to compensate for the out-of-plane distortion of the template, the substrate, or both, iii) provide a first signal to the pressure system such that the pressure system applies the magnitude of back pressure to the template through a first chamber recessed into the template above the first active area, the substrate through a second chamber recessed into the substrate under the second active area, or both the template and the substrate, to compensate for the measured out-of-plane distortion of the template, the substrate, or both prior to determining the magnification correction;

iv) after compensating for the out-of-plane distortion of the template, the substrate, or both, determine a magnitude of additional back pressure based on a desired magnification correction of the second active area of the substrate, and v) provide a second signal to the pressure system such that the pressure system applies the magnitude of additional back pressure to the template, the substrate, or both, such that the second active area of the substrate exhibits the desired magnification correction.

2. The imprint lithography system of claim 1, wherein the template is a master template and the substrate is a replica template.

3. The imprint lithography system of claim 1, further comprising:
 a fluid dispense system configured to dispense an imprint resist on the substrate; and
 a translation system configured to provide relative movement between the substrate and the template such that the template contacts the imprint resist positioned on the substrate to fill pattern features in the first active area of the template with the imprint resist.

4. The imprint lithography system of claim 3, wherein the pressure system is configured to apply the additional back pressure to the template, the substrate, or both, while the template is in contact with the imprint resist.

5. The imprint lithography system of claim 3, further comprising an energy source to provide energy to cure the imprint resist forming a patterned layer on the second active area of the substrate.

6. The imprint lithography system of claim 1, wherein the out-of-plane distortion is one of a convex distortion or a concave distortion.

7. The imprint lithography system of claim 1, wherein the pressure system, based on the second signal, is configured to apply a positive additional back pressure to the template and a negative additional back pressure to the substrate to increase a size of the second active area of the substrate.

8. The imprint lithography system of claim 1, wherein the pressure system, based on the second signal, is configured to apply a negative additional back pressure to the template and a positive additional back pressure to the substrate to decrease a size of the second active area of the substrate based on the desired magnification correction.

* * * * *